(12) United States Patent
Lin et al.

(10) Patent No.: US 12,131,757 B2
(45) Date of Patent: Oct. 29, 2024

(54) DRIVE SECURE COVER PLATE

(71) Applicant: Microsoft Technology Licensing, LLC, Redmond, WA (US)

(72) Inventors: Wu-Shu Lin, New Taipei (TW); Fredrick Anthony Constantino, Rathdrum, ID (US); Kevin Jay Langston, Liberty Hill, TX (US); Chia-Ching Huang, Taipei (TW)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/887,938

(22) Filed: Aug. 15, 2022

(65) Prior Publication Data

US 2024/0055026 A1 Feb. 15, 2024

(51) Int. Cl.
*G11B 33/12* (2006.01)
*G11B 33/02* (2006.01)

(52) U.S. Cl.
CPC .......... *G11B 33/027* (2013.01); *G11B 33/128* (2013.01)

(58) Field of Classification Search
None
See application file for complete search history.

(56) References Cited

U.S. PATENT DOCUMENTS

| | | | | |
|---|---|---|---|---|
| 4,941,841 A | * | 7/1990 | Darden | H05K 5/0286 439/304 |
| 5,216,582 A | * | 6/1993 | Russell | G11B 33/08 |
| 5,435,737 A | * | 7/1995 | Haga | G06F 1/183 439/157 |
| 5,963,422 A | * | 10/1999 | Golobay | G06F 1/184 |
| 6,288,902 B1 | * | 9/2001 | Kim | G11B 33/08 206/707 |
| 6,498,723 B1 | * | 12/2002 | Konshak | G11B 33/08 |
| 6,804,111 B1 | * | 10/2004 | Williams | G11B 33/125 |
| 6,925,843 B1 | * | 8/2005 | Pols Sandhu | G06F 1/183 70/160 |

(Continued)

FOREIGN PATENT DOCUMENTS

| | | | | | |
|---|---|---|---|---|---|
| CN | 102592645 A | * | 7/2012 | | G11B 33/124 |
| CN | 109683682 A | * | 4/2019 | | E05C 19/00 |

(Continued)

OTHER PUBLICATIONS

"International Search Report and Written Opinion Issued in PCT Application No. PCT/US23/026874", Mailed Date: Oct. 13, 2023, 10 Pages.

*Primary Examiner* — William J Klimowicz
(74) *Attorney, Agent, or Firm* — Holzer Patel Drennan

(57) ABSTRACT

A storage drive assembly is provided. The storage drive assembly includes a storage drive sized and shaped for insertion into a slot within a chassis, a latching mechanism coupled to a first end of the storage drive, the latching mechanism including an actuation component actuable to transition the latching mechanism from a locked state in which the latching mechanism restricts displacement of the storage drive relative to the chassis to an unlocked state in which the latching mechanism enables displacement of the storage drive assembly relative to the chassis, and a drive secure cover plate adapted to removably mate with the latching mechanism in the locked state, the mated drive secure cover plate preventing physical access to the actuation component.

19 Claims, 6 Drawing Sheets

(56) References Cited

U.S. PATENT DOCUMENTS

| | | | | |
|---|---|---|---|---|
| 7,511,953 B2* | 3/2009 | Tao | ................ | G11B 33/128 |
| | | | | 361/726 |
| 8,154,863 B2* | 4/2012 | Yang | ................ | G06F 1/187 |
| | | | | 361/679.37 |
| 2005/0207108 A1* | 9/2005 | Chen | ................ | G06F 1/181 |
| | | | | 312/310 |
| 2008/0165490 A1* | 7/2008 | Buckland | ............ | G11B 33/128 |
| 2012/0113583 A1* | 5/2012 | Peng | ................ | G06F 1/187 |
| | | | | 361/679.39 |
| 2012/0147547 A1* | 6/2012 | Lin | ................ | H05K 7/1409 |
| | | | | 248/274.1 |
| 2013/0130528 A1* | 5/2013 | Jun | ................ | H05K 7/1409 |
| | | | | 439/160 |
| 2014/0211423 A1* | 7/2014 | Nguyen | ............ | H05K 7/1409 |
| | | | | 361/728 |
| 2015/0135783 A1* | 5/2015 | Jiang | ................ | H05K 7/1492 |
| | | | | 70/344 |
| 2017/0071071 A1* | 3/2017 | Tseng | ................ | H05K 7/1489 |
| 2018/0073275 A1 | 3/2018 | Ullrich et al. | | |
| 2019/0075666 A1* | 3/2019 | Ehlen | ................ | H05K 7/1487 |
| 2020/0267869 A1 | 8/2020 | Hung et al. | | |
| 2022/0322558 A1* | 10/2022 | Mohanasundaram | ................ | |
| | | | | H05K 5/0021 |

FOREIGN PATENT DOCUMENTS

| | | | | |
|---|---|---|---|---|
| WO | WO-9318517 A1 * | 9/1993 | ............ | G11B 33/128 |
| WO | WO-2008046293 A1 * | 4/2008 | ............ | G06F 1/187 |

* cited by examiner

DRIVE SECURE COVER PLATE

BACKGROUND

Server chassis include slots into which storage drives can be inserted. When inserted, storage drives can be locked in place such that a data coupling between electronic elements of the server chassis and the storage drives is maintained. Storage drives are removed from the slots of the server chassis for maintenance or replacement.

SUMMARY

The described technology provides a storage drive assembly. The storage drive assembly includes a storage drive sized and shaped for insertion into a slot within a chassis, a latching mechanism coupled to a first end of the storage drive, the latching mechanism including an actuation component actuable to transition the latching mechanism from a locked state in which the latching mechanism restricts displacement of the storage drive relative to the chassis to an unlocked state in which the latching mechanism enables displacement of the storage drive assembly relative to the chassis, and a drive secure cover plate adapted to removably mate with the latching mechanism in the locked state, the mated drive secure cover plate preventing physical access to the actuation component.

This summary is provided to introduce a selection of concepts in a simplified form that is further described below in the Detailed Description. This summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

Figure 1:
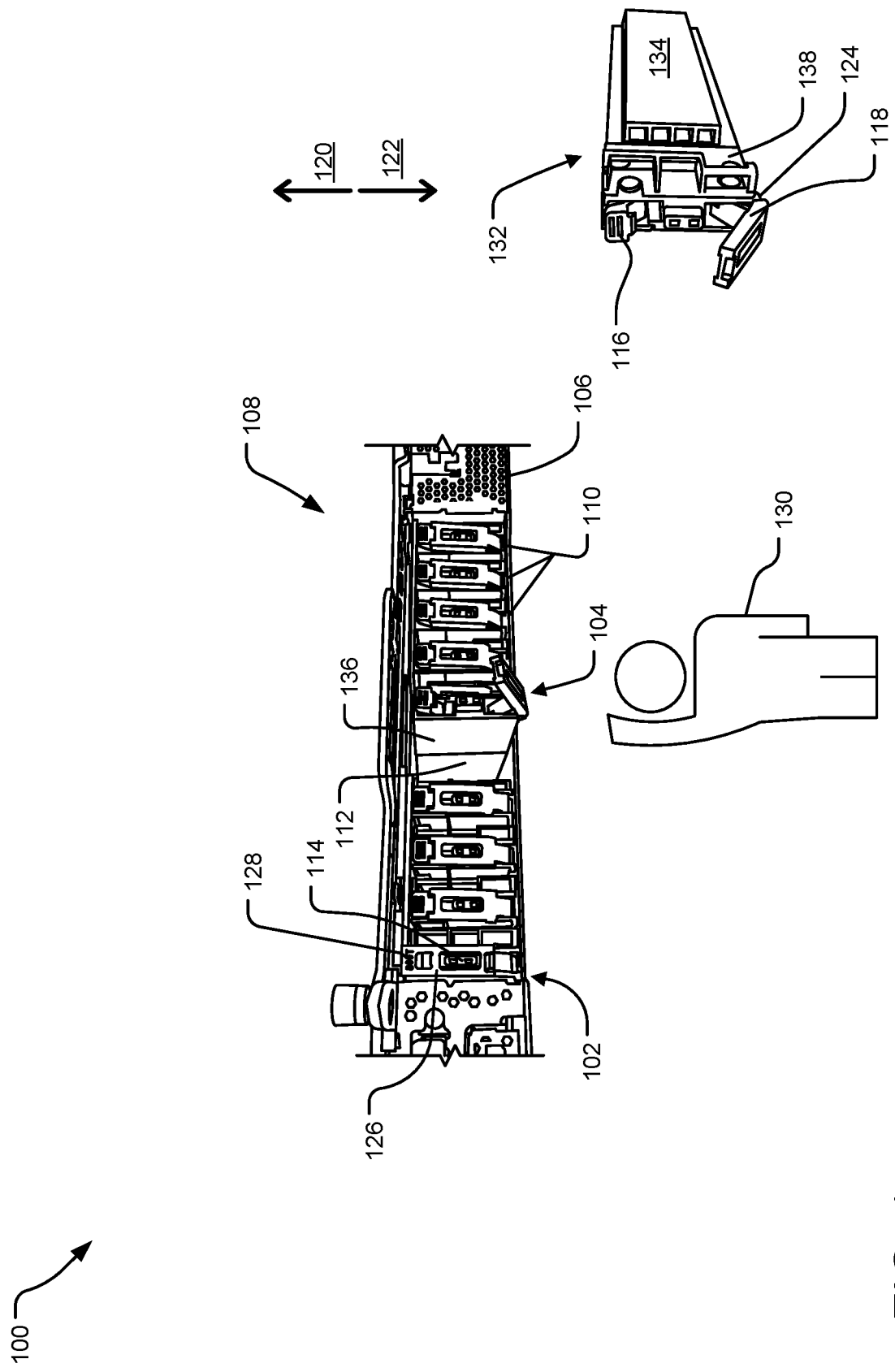
FIG. 1 illustrates an example processing device system.

A chassis includes slots into which storage drives are inserted. In some implementations, a single processing device (e.g., a server) is communicatively coupled to multiple drives that are stored in a same chassis. The chassis may include mechanisms to maintain an electronic coupling between the storage drive and electronic elements (e.g., a printed circuit board) of the processing device. In some implementations, one of the drives in the chassis acts as a boot drive that includes protocols facilitating the operation of the processing device and the coupled storage drives. Without an indication of which storage drive is the boot drive, a user may mistakenly remove the boot drive while the processing device is operational. If a boot drive is removed while the processing device is operational, the processing device can malfunction, and data stored in the storage drives and the processing device memory can be compromised.

The presently disclosed technology provides a drive secure cover plate to prevent the accidental removal of a boot drive from a slot in a chassis for coupling storage drives to a processing device. In implementations, the drive secure cover plate restricts access to and/or prevents the actuation of elements that allow the removal of the boot drive. A user mates the drive secure cover plate to a latching mechanism of a storage drive assembly (e.g., the boot drive), and the latching mechanism is kept in a locked state so long as the drive secure cover plate remains attached. Maintaining the lock of the latching mechanism restricts displacement and/or removal of the storage device assembly from the chassis. Restricting the removal or displacement of the select storage drive assembly functioning as the boot drive can prevent a malfunction of the processing device.

The latching mechanism is adapted to transition between a locked state and an unlocked state. In an implementation, the latching mechanism includes an actuation component. When the actuation component is actuated, the latching mechanism transitions (or is allowed to transition) from the locked state in which the latching mechanism restricts displacement of the storage drive relative to the chassis to the unlocked state in which the latching mechanism enables displacement of the storage drive assembly relative to the chassis. In an implementation, the latching mechanism includes a latch, the release of which enables or causes the transition between the locked state and the unlocked state.

After the actuation component is actuated, the latch is released and swings about a hinge down and away from the storage drive to which the latch is coupled. The hinge is fixed on a position of the latching mechanism. In an implementation, the swinging of the latch causes a locking mechanism to disengage. In an implementation, the release of the latch further causes at least a partial ejection of the storage drive from within the slot of the chassis. The ejection decouples the electronic coupling between the storage drive and the electronic elements of the processing. The drive secure cover plate can be mated (e.g., removably) to the latching mechanism to prevent the latching mechanism from transitioning from a locked state to an unlocked state. Preventing the transition prevents displacement of the storage drive assembly from a slot in the chassis. Preventing the displacement prevents an electronic decoupling of the storage drive assembly from an electronic component (e.g., a printed circuit board) of a computing system.

In an implementation, the drive secure cover plate indicates that the storage drive assembly to which the drive secure cover plate is mated includes a storage drive that functions as a processing device's boot drive. In implementations, the drive secure cover plate restricts physical access to and/or prevents actuation of the actuation component of the latching mechanism. By indicating that the storage drive of the storage drive assembly is a boot drive, restricting physical access to and/or actuation of the actuation component of the latching mechanism, the drive secure cover plate can reduce the likelihood that a user will remove the boot drive from which a processing device operates.

In an implementation, the cover plate is mated with the latching mechanism by a press fit. A press fit, also known as a friction fit or interference fit, provides a simple way for a user to mate the drive secure cover plate to and remove (e.g., unmate) the drive secure cover plate from the latching mechanism of the storage drive assembly. Even if the drive secure cover plate is simple to remove, the extra operation of removing the drive secure cover plate provides extra notice to a user that the storage drive is a boot drive and that the processing device or other system should be powered down before the boot drive is removed.

In an implementation, the drive secure cover plate is an element separate from the chassis. For example, the drive secure cover plate can be mated to and unmated from the latching mechanism without disassembling the chassis. This can save time and effort associated with the assembly and disassembly of the chassis.

In an implementation, the drive secure cover plate is removable from the latching mechanism of a first storage drive assembly and mateable with a different latching mechanism of a second storage drive. In this manner, the processing device can utilize the second storage drive as a boot drive in order to make a storage drive that was previously used as the boot drive removable without consequences to the operation of the processing device. The transfer of the drive secure cover plate to the second storage drive can provide extra protection against the displacement or removal of the new boot drive. A top portion of the drive secure cover plate is adapted to engage an upward-facing surface of the latching mechanism as the drive secure cover plate is mated with the latching mechanism. A tab of the drive secure cover plate is adapted to engage a downward facing surface of the latching mechanism when the drive secure cover plate is mated with the latching mechanism.

In an implementation, the top portion is adapted to apply downward pressure applied to the upward facing surface, the tab is adapted to apply upward pressure to the downward facing surface, and the applied upward pressure and the applied downward pressure at least partially oppose one another to fix the drive secure cover plate relative to the latching mechanism. The opposing upward and downward pressures fix the drive secure cover plate in place on the latching mechanism to maintain the indication that the storage drive of the storage drive assembly is a boot drive.

In an implementation, when the drive secure cover plate is mated with the latching mechanism, the actuation component is positioned between the upper portion and the tab. In an implementation, the drive secure cover plate restricts physical access to the actuation component to limit a user's ability to remove the storage drive assembly from a slot of the chassis when the drive secure cover plate is mated to the latching mechanism. Also, additionally or alternatively, the opposing upward and downward pressure prevents the actuation of the actuation component by providing pressure in a direction opposite the direction of motion required to actuate the actuation component. The drive secure cover plate restricting access to and/or preventing actuation of the actuation component can further protect the processing device from malfunction resulting from the removal of a boot drive from which the processing device operates.

FIG. 1 illustrates an example processing device system 100. The processing device system 100 includes a chassis 106 that houses several storage drive assemblies. The storage device assemblies may be understood as having similar or identical features. These features are described below with respect to a first storage drive assembly 102, a second storage drive assembly 104, and a third storage drive assembly 132. In an implementation, the chassis 106 couples each of the storage drives to a processing device 108. The first storage drive assembly 102, the second storage drive assembly 104, and the third storage drive assembly 132 each include a storage drive and a latching mechanism coupled to the storage drive on a first end of the storage drive.

In the illustrated implementation, the first storage drive assembly 102 is shown fully inserted into a slot 110 of the chassis 106. In this example, the first storage drive assembly 102 includes a first storage drive (concealed by the chassis 106 from the perspective of FIG. 1) which functions as a boot drive of the processing device 108. A boot drive is a drive that stores and provides an operating system from which the processing device 108 operates. Displacing or removing a boot drive, such as the first storage drive of the first storage drive assembly 102, from a slot 110 of the chassis 106 can disrupt an electronic connection between the first storage drive and an electronic element (e.g., a printed circuit board) of the processing device 108. Because the first storage drive is a boot drive from which the processing device 108 executes an operating system, the disruption of the electronic connection can cause errors in or even failure of the processing device 108. In implementations in which the processing device 108 is a server with multiple storage drives, disruption of the electronic connection can cause errors in the processing device 108 and other storage drives attempting to store data at the time of the disruption.

The second storage drive assembly 104 is illustrated as being actively removed, by a user 130, from a slot 110 of the chassis 106. The second storage drive assembly 104 includes a second storage drive 112 that is not a boot drive of the processing device 108. The second storage drive 112 of the second storage drive assembly 104 is not a drive from which the operating system of the processing device 108 executes. The second storage drive 112 is a drive on which the processing device 108 stores data for use by the operating system stored on and executed from the first storage drive. Displacement within or removal of the second storage drive 112 of the second storage drive assembly 104 from the slot 110 of the chassis 106 disrupts an electronic connection between the second storage drive 112 and an electronic component of the processing device 108. If the disruption occurs during a storing operation, the data to be stored may be corrupted. However, unlike with a boot storage drive, such as the first storage drive, the disruption with the second storage drive 112 of the second storage drive assembly 104 will not generally cause the processing device 108 to fail. An operating system of the processing device 108 executes from the first storage drive, so the damage to the system and data from removal of the second storage drive 112 is limited to the storage operations (e.g., reads, writes, erasures, etc.) of the second storage drive 112.

The third storage drive assembly 132 is illustrated as completely removed from the chassis 106. The third storage drive assembly 132 also includes a third storage drive 134 that is not a boot drive of the processing device 108.

A latching mechanism included on each of the storage assemblies in the chassis 106 is visible on the illustrated storage drive assemblies 102, 104, and 132. Specifically, the first storage drive assembly 102 includes a first latching mechanism 114 attached to the first storage drive. The second storage drive assembly 104 includes a second latching mechanism 136 attached to the second storage drive 112. The third storage drive assembly 132 includes a third latching mechanism 138 attached to a third storage drive 134. The latching mechanisms 114, 136, and 138 are identical and are described below with respect to the third latching mechanism 138. In an implementation, the third latching mechanism 138 includes an actuation component 116 and a latch 118. In this implementation, engagement of the actuation component 116 causes actuation of the actuation component 116. For example, selectively moving the actuation component 116 in a direction (e.g., an upwards direction 120) to a predefined position causes the release of the latch 118. When released, the latch 118 swings in a direction (e.g., in a downward direction 122 and away from the third storage drive 134) about a hinge 124 that couples the latch 118 to the rest of the third latching mechanism 138. The release of the latch 118 causes the third latching mechanism 138 to transition from a locked state in which the third latching mechanism 138 restricts displacement of the third storage drive assemblies 132 relative to the chassis 106 to an unlocked state in which the third latching mechanism 138 enables displacement of the third storage drive assembly 132 relative to the chassis 106. In an implementation, the swinging of the latch 118 disengages a locking mechanism, causing the transition.

In an implementation, when the third latching mechanism 138 is in the locked state within the chassis 106, the release of the latch 118 further causes at least a partial ejection of the third storage drive 134 from within the slot of the chassis 106. The ejection decouples the electronic coupling between the third storage drive 134 and electronic elements (e.g., a printed circuit board) of the processing device 108.

A drive secure cover plate 126 is adapted to be mated (e.g., removably) to the first latching mechanism 114 of the first storage drive assembly 102 to prevent the first latching mechanism 114 from transitioning from the locked state to the unlocked state. To prevent the transition, the drive secure cover plate 126 provides notice to the user 130 that the first storage drive assembly 102 includes the first storage drive, which functions as the processing device's 108 boot drive. In an implementation, the drive secure cover plate 126 further prevents the transition by restricting the user's 130 physical access to and/or preventing the user 130 from actuating a first actuation component (not visible in the illustration) of the first latching mechanism 114. Preventing the transition prevents the electronic decoupling of the first storage drive of the first storage drive assembly 102 from electronic components of the processing device 108. Accordingly, the drive secure cover plate 126 can help prevent processing device 108 malfunctions due to the loss of the operating system functionality. The drive secure cover plate 126 mates with the first latching mechanism 114 using one or more of a press fit or another coupling method. A press fit, also known as a friction fit or interference fit, provides a quick and simple mechanism to mate the drive secure cover plate 126 to and remove the drive secure cover plate 126 from the first latching mechanism 114. The drive secure cover plate 126 is removable from the first latching mechanism 114 to expose the first latching mechanism 114 and allow removal of the first storage drive assembly 102 as described herein.

In an implementation, the drive secure cover plate 126 includes a visible indicator 128 that the first storage drive of the first storage drive assembly 102 to which the drive secure cover plate 126 is mated is a boot drive. Although illustrated as text explicitly stating "BOOT," implementations are contemplated in which the visible indicator 128 includes a colored portion, an embossed portion, a pattern, or another distinguishing feature that distinguishes the appearance of the secure cover plate 126 from surfaces of latching mechanisms of other storage drive assemblies (e.g., the second latching mechanism 136 and the third latching mechanism 138). The visible indicator 128 provides an additional layer of protection by directly informing a user 130 that the first storage drive of the first storage drive assembly 102 is a boot drive and should not be disturbed without shutting down the processing device 108.

In an implementation, the drive secure cover plate 126 prevents the transition from the locked to the unlocked state by restricting physical access to a first actuation component (e.g., an actuation component analogous to the actuation component 116 of the third latching mechanism 138) of the first latching mechanism 114. The restricted physical access prevents the actuation of the first actuation component. In an implementation, the restricted physical access includes covering the first actuation component to partially or completely obscure the first actuation component (as illustrated) when the drive secure cover plate 126 is mated with the first latching mechanism 114.

In an implementation, the drive secure cover plate 126 physically opposes the actuation of the first actuation component. For example, the drive secure cover plate 126 includes a tab (see tab 408 in FIG. 4) and a top portion (see top portion 406 in FIG. 4) that apply opposing pressures to the first actuation component and another part of the first latching mechanism 114 (e.g., a portion of a first latch of the first latching mechanism analogous to the latch 118 of the third latching mechanism 138). The opposing pressures restrict the actuation of the first actuation component. The opposing pressures oppose the motion of the first actuation component in a direction (e.g., the upward direction 120) that actuates the first actuation component to cause the first latching mechanism 114 to transition from the unlocked state to the locked state. In so doing, the drive secure cover plate 126 can prevent unwanted displacement of the first storage drive (that functions as the boot drive of the processing device 108).

In an implementation, the top portion is adapted to apply downward pressure applied to an upward facing surface of the first latching mechanism 114 or the chassis 106, and the tab is adapted to apply upward pressure to a downward facing surface of the first latching mechanism 114 or the chassis 106. In this implementation, the applied upward pressure and the applied downward pressure at least partially oppose one another to fix the drive secure cover plate 126 relative to the first latching mechanism 114 and/or the chassis 106. At least a portion of the actuation component is positioned between the top portion and the tab when the drive secure cover plate 126 is mated with the first latching mechanism 114. In an implementation, the upward facing surface is a surface of the first actuation component, and the downward facing surface is a surface of the first latch.

To switch the boot functionality to a different storage drive, the processing device 108 designates a new storage drive as the boot drive. This procedure can include restarting the processing device 108 and booting from the new boot drive. The drive secure cover plate 126 is removed from the first storage drive assembly 102 with the first drive that previously functioned as the boot drive and can be mated with the new storage drive that will function as the boot drive.

Figure 2:
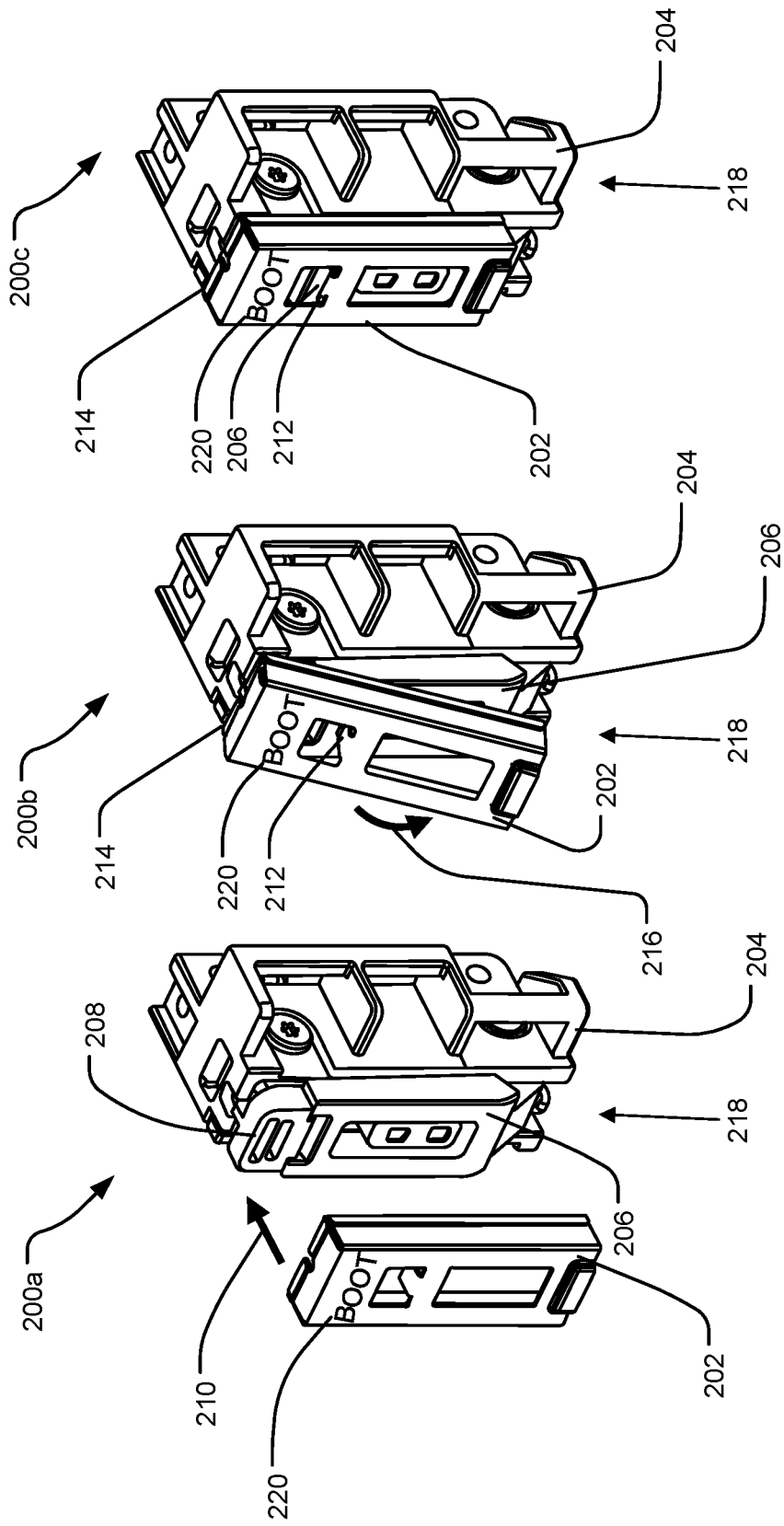
FIG. 2 illustrates example states in a progression of mating a drive secure cover plate to a latching mechanism.

FIG. 2 illustrates example states 200a-200c in a progression of mating a drive secure cover plate 202 with a latching mechanism 204 of a storage drive assembly 218. Although the storage drive assembly 218 is not shown in full in FIG. 2, features of the storage drive assembly 218 may be assumed to be the same or similar to those features shown and described above with respect to second storage drive assembly 104 in FIG. 1 (e.g., the storage drive assembly 218 includes an unillustrated storage drive, the cover plate 202, and the latching mechanism 204).

In an implementation, the drive secure cover plate 202 includes a visible indicator 220 that the storage drive to which the drive secure cover plate 202 is mated is a boot drive. Although illustrated as text explicitly stating "BOOT," implementations are contemplated in which the visible indicator 220 includes a colored portion, an embossed portion, a pattern, or another distinguishing feature that distinguishes the appearance of the secure cover plate 202 from surfaces of latching mechanisms 204 of other storage drive assemblies.

The drive secure cover plate 202 is capable of being mated with the latching mechanism 204 when the storage drive assembly 218 is in the locked state. In an implementation, the mating includes a transition from an unmated state 200a to a mating state 200b and a further transition from the mating state 200b to a mated state 200c. In the unmated state 200a, the drive secure cover plate 202 and the latching mechanism 204 are unmated. An actuation component 208 is physically accessible and engageable by a user to be actuated. Actuation of the actuation component 208 releases a latch 206 that is included on a storage drive assembly 218 and allows the latching mechanism 204 to transition from the locked state to the unlocked state. The mating of the drive secure cover plate 202 prevents or restricts the transition. To transition from the unmated state 200a to a mating state 200b in the progression, the drive secure cover plate 202 is pressed in a proximal direction 210 against the latching mechanism 204.

The mating state 200b illustrates the mating between the drive secure cover plate 202 and the latching mechanism 204. In the illustrated implementation, a top portion 214 of the drive secure cover plate 202 is engaged with an upward-facing surface of the actuation component 208. The plate is then swung in a downward and proximal direction 216 relative to the storage drive assembly 218 (e.g., using the engagement of the top portion 214 and the actuation component 208 as a pivot or fulcrum) to engage a tab 212 of the drive secure cover plate 202 to a downward facing surface of the latch 206. In an implementation, the space between the top portion 214 and the tab 212 is less than or substantially equal to the space between the upward facing surface and the downward facing surface. For example, the top portion 214 applies a downward force on the actuation component 208 and applies an upward force on the latch 206. The upward force and the downward force oppose one another to make a press fit between the drive secure cover plate 202 and the latching mechanism 204. The swing in the downward and proximal direction 216 progresses the mating state 200b to a mated state 200c. In an implementation, the mating does not include swinging but merely involves pressing the device secure cover plate 202 to fit the latching mechanism 204.

The mated state 200c is a state in which the drive secure cover plate 202 is mated with the latching mechanism 204. In the mated state 200c, the drive secure cover plate 202 at least partially obscures the actuation component 208, at least partially restricts physical access to the actuation component 208, and/or at least partially restricts motion or actuation of the actuation component 208 is at least partially restricted. In the illustrated implementation, the drive secure cover plate 202 completely obscures the actuation component 208, preventing physical access to the actuation component 208. Implementations are also contemplated in which the actuation component 208 is partially exposed and/or partially physically accessible through the drive secure cover plate 202. The opposing downward and upward forces applied by the top portion 214 and the tab 212, respectively, cause a press fit that restricts motion and/or actuation of the actuation element. In the mated state 200c, the drive secure cover plate 202 restricts the actuation of the actuation component 208. The restriction prevents the latching mechanism 204 from transitioning from the locked state to the unlocked state. In an implementation, in the mated state 200c, the drive secure cover plate 202 at least partially surrounds or circumscribes a portion of the latching mechanism 204. In an implementation, a peripheral portion of the drive secure over plate 202 partially surrounds a portion of the latching mechanism to press fit about the portion of the latching mechanism 204.

Figure 3:
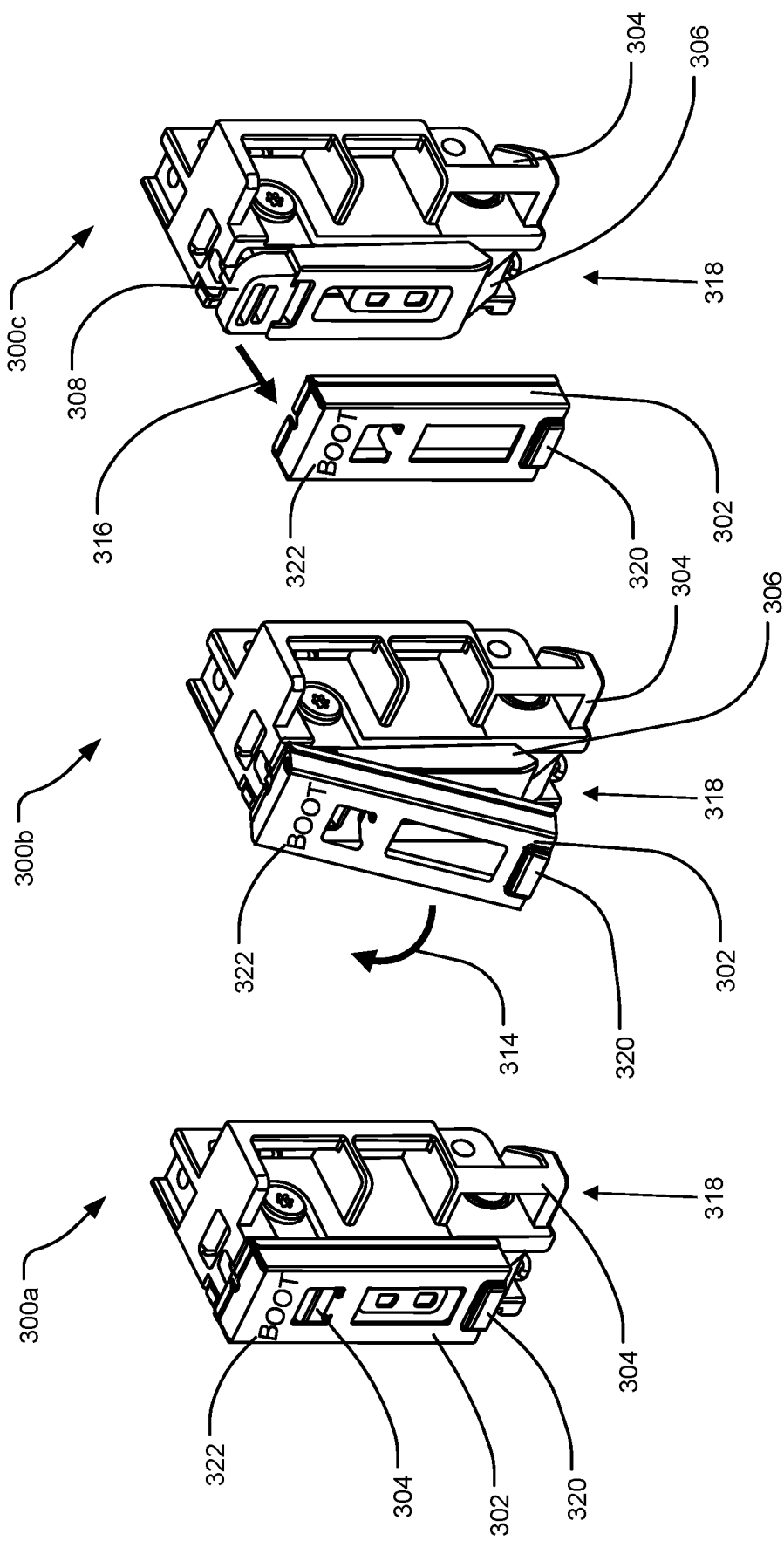
FIG. 3 illustrates states of an example progression of removing a drive secure cover plate from a latching mechanism.

FIG. 3 illustrates states 300a-c of an example progression of removing or unmating a drive secure cover plate 302 from a latching mechanism 304 included in a storage drive assembly 318. The drive secure cover plate 302 is capable of being removed or unmated from the latching mechanism 304 when the storage drive assembly 318 is in the locked state. In an implementation, the removal or unmating includes a transition from a mated state 300a to a removing state 300b and a further transition from the removing state 300b to an unmated state 300c. In one implementation, the mated state 300a of FIG. 3 is substantially the same as the mated state 200c of FIG. 2. In the mated state 300a, a drive secure cover plate 302 is mated with a latching mechanism 304. To transition from the mated state 300a to a removing state 300b, the drive secure cover plate 302 is swung in an upward and distal direction 314 relative to the storage drive assembly 318 (e.g., using an engagement of a top portion of the drive secure cover plate 302 and an upward facing surface of the actuation component 308 as a pivot or fulcrum). The removing state 300b is a state in which drive secure cover plate 302 is in the process of being removed from the latching mechanism 304. In an implementation, removing the drive secure cover plate 302 from the latching mechanism 304 does not include swinging but merely involves pulling the device secure cover plate 302 away from the latching mechanism 304.

In an implementation, the drive secure cover plate 302 includes a visible indicator 322 that the storage drive to which the drive secure cover plate 302 is mated is a boot drive. In an implementation, the drive secure cover plate 302 includes a grip 320 to provide a point of engagement for a user to swing the drive secure cover plate 302. In an implementation, the grip 320 is a raised or embossed portion of the drive secure cover plate 302. The raised or embossed portion provides space between the drive secure cover plate 302 and the latching mechanism 304 to allow a user to insert an element (e.g., a finger or fingernail) to provide a force in a distal direction 316 to the drive secure cover plate 302 relative to the latching mechanism 304, facilitating easier removal of the drive secure cover plate 302. The swing in the upward and distal direction 314 overcomes any press fit between the drive secure cover plate 302 and the latching mechanism. To transition from the removing state 300b to an unmated state 300c, the drive secure cover plate 302 is pulled in a distal direction 316 away from the latching mechanism 304. In one implementation, the unmated state 300c of FIG. 3 is substantially the same as the unmated state 200a of FIG. 2.

Figure 4:
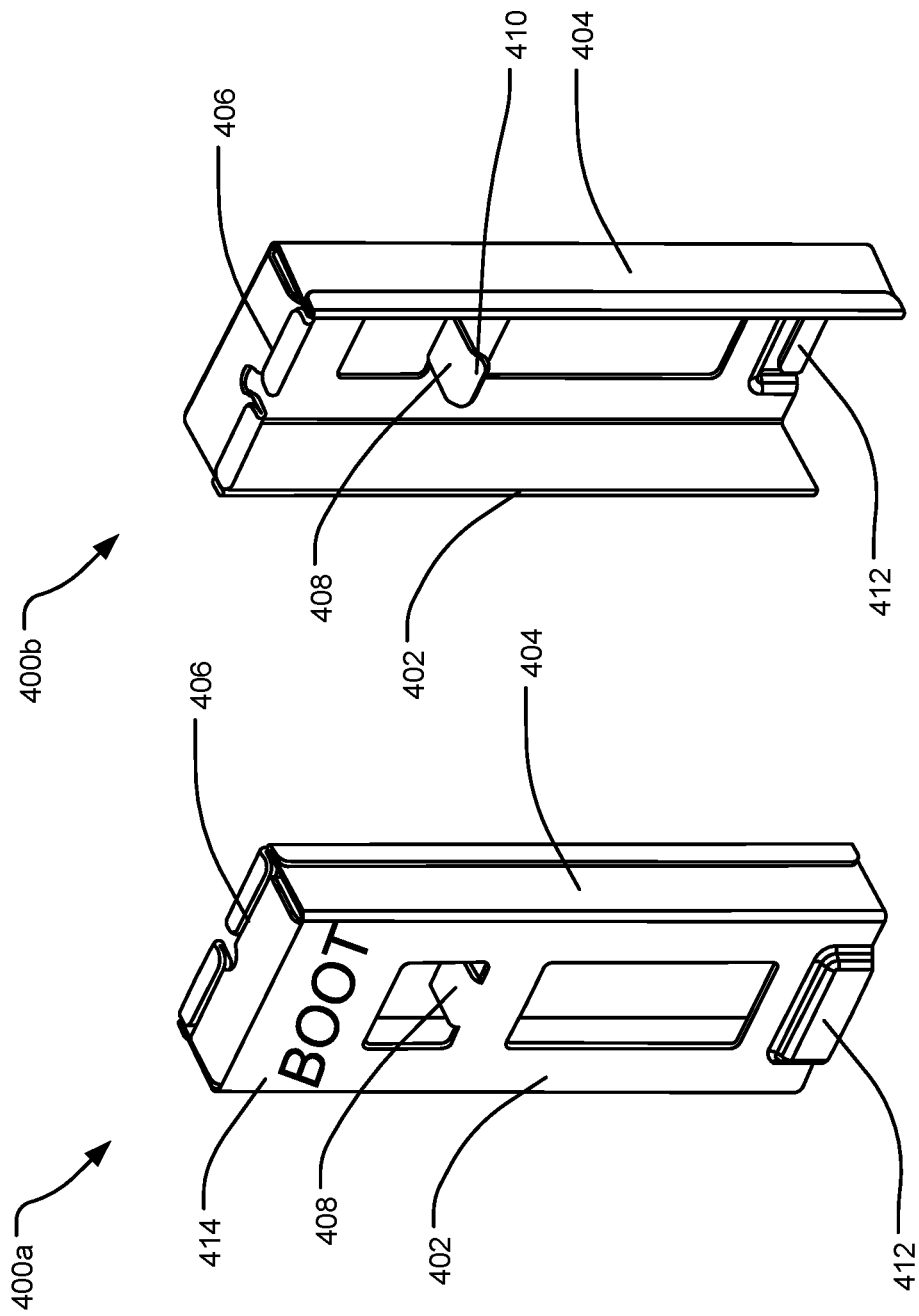
FIG. 4 illustrates perspectives of an implementation of a drive secure cover plate.

FIG. 4 illustrates perspectives 400a, 400b of an implementation of a drive secure cover plate 402 usable to restrict access to and/or prevent accidental removal of a storage drive assembly (not shown) from a chassis. Specifically, perspective 400a is a front perspective, and 400b is a rear perspective. In an implementation, the drive secure cover plate 402 includes a protruding peripheral portion 404 configured to partially surround and/or pressure fit about a portion of a latching mechanism. In an implementation, the peripheral portion 404 includes a top portion 406. The drive secure cover plate 402 further includes a tab 408. The tab 408 includes a terminal guiding edge 410. The drive secure cover plate further includes a grip 412. In an implementation, the drive secure cover plate 402 further includes a visible indicator 414 that the storage drive to which the drive secure cover plate 402 is mated is a boot drive.

In an implementation, the top portion 406 and the tab 408 are a predefined distance apart that is smaller than or substantially the same as a distance between an upward facing surface and a downward facing surface of the latching mechanism configured to mate with the drive secure cover plate 402. The relative distances cause the top portion 406 and the tab 408 to apply at least partially opposing pressures on the upward facing and downward facing surfaces of the latching mechanism. In an implementation, the top portion 406 is adapted to apply downward pressure to an upward facing surface of the latching mechanism or a chassis, and the tab 408 is adapted to apply upward pressure to a downward facing surface of the latching mechanism or the chassis. In this implementation, the applied upward pressure and the applied downward pressure at least partially oppose one another to fix the drive secure cover plate relative to the latching mechanism and/or the chassis. At least a portion of the actuation component is positioned between the top portion and the tab when the drive secure cover plate 402 is mated with the latching mechanism. In an implementation, the upward facing surface is a surface of an actuation component of the latching mechanism, and the downward facing surface is a surface of a latch of the latching mechanism.

The terminal guiding edge 410 is configured to guide the tab 408 into a position to engage the latching mechanism. In the illustrated implementation, the guiding edge is angled in a downward direction and away from a surface of the tab 408 configured to engage the latching mechanism.

In an implementation, the grip 412 is a raised or embossed portion of the drive secure cover plate 402. The raised or embossed portion provides space between the drive secure cover plate 402 and the latching mechanism. The space allows a user to insert an element (e.g., a finger or fingernail) to provide a distal force to the drive secure cover plate 402 relative to the latching mechanism, facilitating easier removal of the drive secure cover plate 402.

Figure 5:
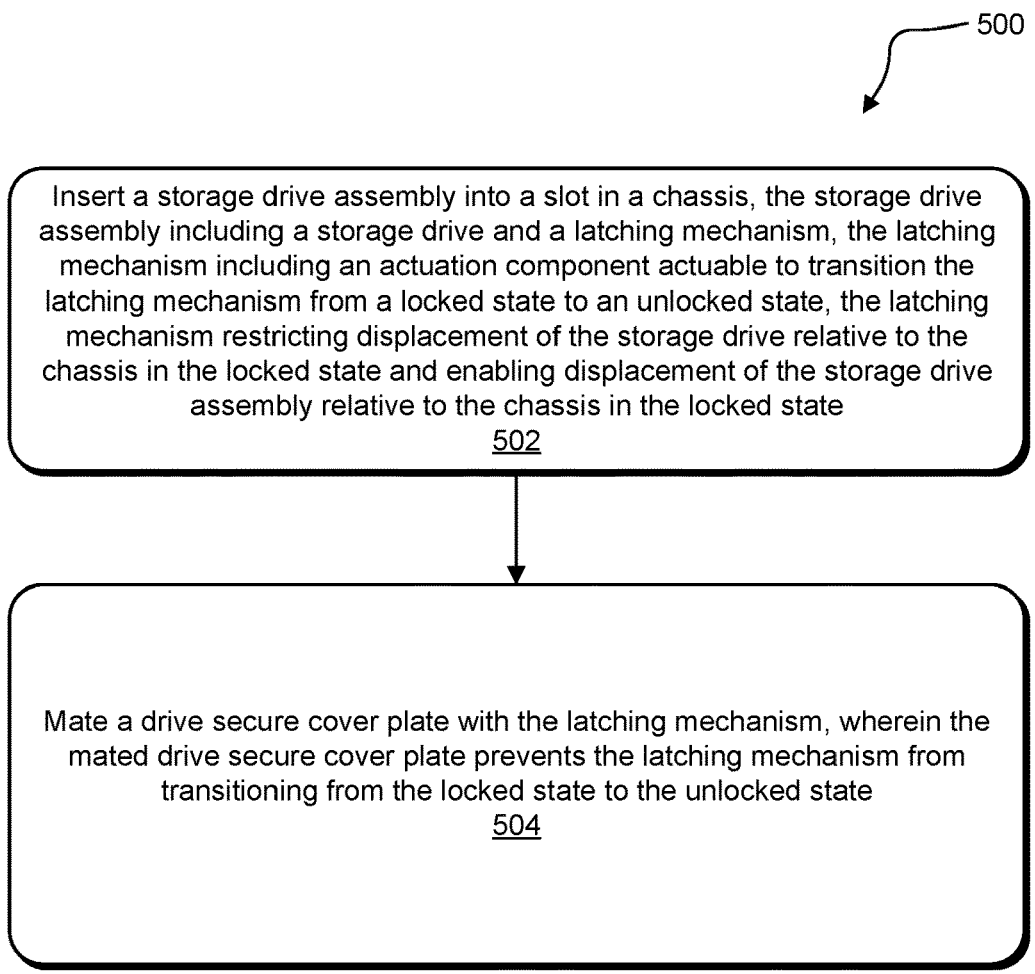
FIG. 5 illustrates example operations for mating a drive secure cover plate with a latching mechanism.
Figure 6:
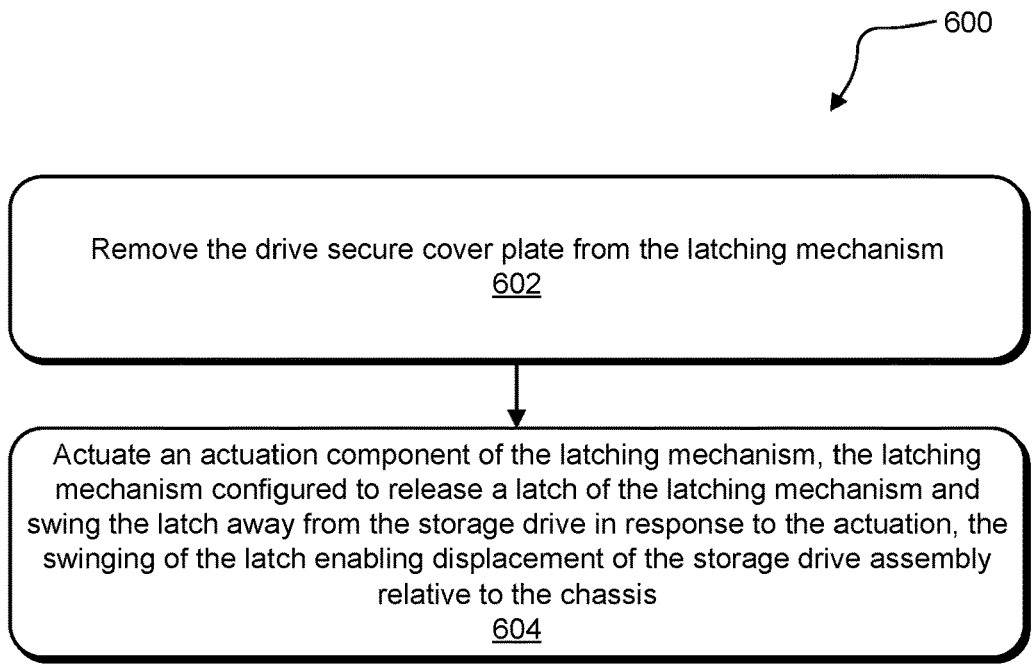
FIG. 6 illustrates example operations of removing or unmating a drive secure cover plate from a latching mechanism.

FIGS. 5-6 illustrate operations for manipulating a storage drive assembly relative to a chassis. Specifically, FIG. 5 illustrates example operations 500 for mating a drive secure cover plate with a latching mechanism. An inserting operation 502 inserts a storage drive assembly into a slot in the chassis. The storage drive assembly includes a storage drive and a latching mechanism. The latching mechanism includes an actuation component actuable to transition the latching mechanism from a locked state to an unlocked state. The latching mechanism restricts displacement of the storage drive relative to the chassis in the locked state and enables displacement of the storage drive assembly relative to the chassis in the locked state The inserting operation 502 causes a latching mechanism of the storage drive assembly to transition from an unlocked state in which a latch of the latching mechanism enables displacement of the storage drive relative to the chassis to a locked state in which the latch restricts displacement of the storage drive relative to the chassis. In an implementation, the inserting operation 502 includes electrically coupling a storage drive of the storage drive assembly to an electronic component of the chassis (e.g., a printed circuit board (PCB)) and/or a processing device the chassis couples to the storage drive. The latching mechanism maintains this electronic coupling in the locked state by restricting the displacement of the storage drive assembly within the chassis. In this implementation, the electrical coupling is disruptable by physically displacing the storage drive assembly after transitioning the latching mechanism from the locked state to the unlocked state.

A mating operation 504 mates a drive secure cover plate with the latching mechanism. The mated drive secure cover prevents the latching mechanism from transitioning from the locked state to the unlocked state. In an implementation, the mating includes pressing the drive secure cover plate to friction fit around a portion of the latching mechanism, including an actuation component. In an implementation, the mating operation 504 includes applying downward pressure by a top portion of the drive secure cover plate on an upward facing surface of the latching mechanism and applying upward pressure by a tab of the drive secure cover plate to a downward facing surface of the latching mechanism. In this implementation, the applied upward pressure and the applied downward pressure at least partially oppose one another to fix the drive secure cover plate relative to the latching mechanism by generating a press fit (also known as a friction fit or interference fit) of the drive secure cover plate to the latching mechanism. In an implementation, the at least partially opposing applied upward pressure and applied downward pressure restrict an actuating motion of the actuation component. In an implementation, after the drive secure cover plate is mated to the latching mechanism in mating operation 504, at least a portion of the actuation component is positioned between the top portion and the tab of the mated drive secure cover plate. In an implementation, the upward facing surface is a surface of the actuation component, and the downward facing surface is a surface of the latch.

FIG. 6 illustrates example operations 600 of removing or unmating a drive secure cover plate from a latching mechanism mated to the drive secure cover plate. A removing operation 602 removes the drive secure cover plate from the latching mechanism. An actuating operation 604 actuates an actuation component of the latching mechanism. The latching mechanism is configured to release a latch of the latching mechanism and rotate the latch away from the storage drive in response to the actuation. In an implementation, the rotation of the latch displaces the storage drive assembly relative to the chassis. In an implementation, the actuating operation 604 is omitted if the user does not desire to remove the storage drive assembly from the chassis. For example, in an implementation in which a computing system designates a new boot drive, the removing operation 602 includes removing the drive secure cover plate from the latching mechanism. In this implementation, a further mating operation (not illustrated) mates the drive secure cover plate with a second latching mechanism coupled to a first end of a second storage drive positioned within another slot of the chassis without disassembling the chassis.

The logical operations making up implementations of the technology described herein may be referred to variously as operations, steps, objects, or modules. Furthermore, it should be understood that logical operations may be performed in any order, adding or omitting operations as desired, regardless of whether operations are labeled or identified as optional, unless explicitly claimed otherwise or a specific order is inherently necessitated by the claim language.

An example storage drive assembly is provided. The storage drive assembly includes a storage drive sized and shaped for insertion into a slot within a chassis and a latching mechanism coupled to a first end of the storage drive, the latching mechanism including an actuation component actuable to transition the latching mechanism from a locked state in which the latching mechanism restricts displacement of the storage drive relative to the chassis to an unlocked state in which the latching mechanism enables displacement of the storage drive assembly relative to the chassis. The storage drive assembly further includes a drive secure cover plate adapted to removably mate with the latching mechanism in the locked state, the mated drive secure cover plate preventing physical access to the actuation component.

Another example storage drive assembly of any preceding assembly is provided, wherein removable mating of the drive secure cover plate with the latching mechanism is by friction fit.

Another example storage drive assembly of any preceding assembly is provided, wherein the drive secure cover plate is adapted to be removed from the latching mechanism without disassembling the chassis.

Another example storage drive assembly of any preceding assembly is provided, wherein the latching mechanism further includes a latch adapted to be selectively released responsive to actuation of the actuation component, wherein releasing the latch causes the latch to rotate away from the storage drive assembly and displaces the storage drive assembly relative to the chassis.

Another example storage drive assembly of any preceding assembly is provided, wherein the storage drive is physically fixed in the chassis and electrically coupled to a printed circuit board (PCB) of the chassis in the locked state, and displacement of the storage drive assembly disrupts the electrical coupling.

Another example storage drive assembly of any preceding assembly is provided, the drive secure cover plate including a top portion adapted to engage an upward facing surface of the latching mechanism when the drive secure cover plate is mated with the latching mechanism and a tab adapted to engage a downward facing surface of the latching mechanism when the drive secure cover plate is mated with the latching mechanism.

Another example storage drive assembly of any preceding assembly is provided, the tab including a guiding edge adapted to guide the engagement between the tab and the downward facing surface.

Another example storage drive assembly of any preceding assembly is provided, wherein the top portion is adapted to apply downward pressure to the upward facing surface, the tab is adapted to apply upward pressure to the downward facing surface, and the applied upward pressure and the applied downward pressure at least partially opposing one another to fix the drive secure cover plate relative to the latching mechanism.

Another example storage drive assembly of any preceding assembly is provided, wherein the downward pressure opposes actuation of the actuation component.

Another example storage drive assembly of any preceding assembly is provided, wherein at least a portion of the actuation component is positioned between the top portion and the tab when the drive secure cover plate is mated with the latching mechanism.

Another example storage drive assembly of any preceding assembly is provided, the latching mechanism further including a latch adapted to be selectively released in response to actuation of the actuation component, wherein the upward facing surface is a surface of the actuation component, and the downward facing surface is a surface of the latch.

An example method is provided. The method includes inserting a storage drive assembly into a slot in a chassis, the storage drive assembly including a storage drive and a latching mechanism, the latching mechanism including an actuation component actuable to transition the latching mechanism from a locked state to an unlocked state, the latching mechanism restricting displacement of the storage drive relative to the chassis in the locked state and enabling displacement of the storage drive assembly relative to the chassis in the locked state and mating a drive secure cover plate with the latching mechanism, wherein the mated drive secure cover plate prevents the latching mechanism from transitioning from the locked state to the unlocked state.

Another example method of any preceding method is provided, wherein the mating includes pressing the drive secure cover plate to friction fit around a portion of the latching mechanism, the portion including an actuation component configured to transition the storage drive assembly from the locked state to the unlocked state when actuated.

Another example method of any preceding method is provided, the method further including removing the drive secure cover plate from the latching mechanism and mating the drive secure cover plate with a second latching mechanism coupled to a first end of a second storage drive positioned within another slot of the chassis without disassembling the chassis.

Another example method of any preceding method is provided, the method further including removing the drive secure cover plate from the latching mechanism and actuating an actuation component of the latching mechanism, the latching mechanism configured to release a latch of the latching mechanism and swing the latch away from the storage drive in response to the actuation, the swinging of the latch enabling displacement of the storage drive assembly relative to the chassis.

Another example method of any preceding method is provided, wherein the inserting includes electrically coupling the storage drive assembly to a printed circuit board (PCB) of the chassis, the electrical coupling disruptable by physically displacing the storage drive assembly in the unlocked state.

Another example method of any preceding method is provided, wherein the mating includes applying downward pressure by a top portion of the drive secure cover plate on an upward facing surface of the latching mechanism and applying upward pressure by a tab of the drive secure cover plate to a downward facing surface of the latching mechanism. The applied upward pressure and the applied downward pressure at least partially oppose one another to fix the drive secure cover plate relative to the latching mechanism.

Another example method of any preceding method is provided, wherein the at least partially opposing applied upward pressure and applied downward pressure oppose an actuating motion of an actuation component of the latching mechanism, the actuating motion of the actuation component configured to transition the storage drive assembly from the locked state to the unlocked state when actuated.

Another example method of any preceding method is provided, wherein at least a portion of an actuation component of the latching mechanism configured to transition the storage drive assembly from the locked state to the unlocked state when actuated is positioned between the top portion and the tab of the mated drive secure cover plate.

Another example method of any preceding method is provided, wherein the latching mechanism includes a latch positioned below an actuation component of the latching mechanism, the actuation component configured to transition the storage drive assembly from the locked state to the unlocked state when actuated, the latch adapted to be selectively released in response to actuation of the actuation component, the upward facing surface being a surface of the actuation component, and the downward facing surface being a surface of the latch.

An example system is provided. The system includes means for inserting a storage drive assembly into a slot in a chassis, the storage drive assembly including a storage drive and a latching mechanism, the latching mechanism including an actuation component actuable to transition the latching mechanism from a locked state to an unlocked state, the latching mechanism restricting displacement of the storage drive relative to the chassis in the locked state and enabling displacement of the storage drive assembly relative to the chassis in the locked state. The system further includes means for mating a drive secure cover plate with the latching mechanism, wherein the mated drive secure cover plate prevents the latching mechanism from transitioning from the locked state to the unlocked state.

Another example system of any preceding system is provided, wherein the means for mating includes means for pressing the drive secure cover plate to friction fit around a portion of the latching mechanism, the portion including an actuation component configured to transition the storage drive assembly from the locked state to the unlocked state when actuated.

Another example system of any preceding system is provided, the system further including means for removing the drive secure cover plate from the latching mechanism and means for mating the drive secure cover plate with a second latching mechanism coupled to a first end of a second storage drive positioned within another slot of the chassis without disassembling the chassis.

Another example system of any preceding system is provided, the system further including means for removing the drive secure cover plate from the latching mechanism and means for actuating an actuation component of the latching mechanism, the latching mechanism configured to release a latch of the latching mechanism and swing the latch away from the storage drive in response to the actuation, the swinging of the latch enabling displacement of the storage drive assembly relative to the chassis.

Another example system of any preceding system is provided, wherein the means for inserting includes means for electrically coupling the storage drive assembly to a printed circuit board (PCB) of the chassis, the electrical coupling disruptable by physically displacing the storage drive assembly in the unlocked state.

Another example system of any preceding system is provided, wherein the means for mating includes means for applying downward pressure by a top portion of the drive secure cover plate on an upward facing surface of the latching mechanism and means for applying upward pressure by a tab of the drive secure cover plate to a downward facing surface of the latching mechanism. The applied upward pressure and the applied downward pressure at least partially oppose one another to fix the drive secure cover plate relative to the latching mechanism.

Another example system of any preceding system is provided, wherein the at least partially opposing applied upward pressure and applied downward pressure oppose an actuating motion of an actuation component of the latching mechanism, the actuating motion of the actuation component configured to transition the storage drive assembly from the locked state to the unlocked state when actuated.

Another example system of any preceding system is provided, wherein at least a portion of an actuation component of the latching mechanism configured to transition the storage drive assembly from the locked state to the unlocked state when actuated is positioned between the top portion and the tab of the mated drive secure cover plate.

Another example system of any preceding system is provided, wherein the latching mechanism includes a latch positioned below an actuation component of the latching mechanism, the actuation component including means to transition the storage drive assembly from the locked state to the unlocked state when actuated, the latch including means for selectively releasing in response to actuation of the actuation component, the upward facing surface being a surface of the actuation component, and the downward facing surface being a surface of the latch.

While this specification contains many specific implementation details, these should not be construed as limitations on the scope of any technologies or of what may be claimed, but rather as descriptions of features specific to particular implementations of the particular described technology. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order or that all illustrated operations be performed to achieve desirable results. In some cases, the actions recited in the claims can be performed in a different order and still achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Thus, particular implementations of the subject matter have been described. Other implementations are within the scope of the following claims. Nevertheless, it will be understood that various modifications can be made without departing from the spirit and scope of the recited claims.

As used herein, terms such as "substantially," "about," "approximately," or other terms of relative degree are interpreted as a person skilled in the art would interpret the terms and/or amount to a magnitude of variability of one or more of 1%, 2%, 3%, 4%, 5%, 6%, 7%, 8%, 9%, 10%, 11%, 12%, 13%, 14%, or 15% of a metric relative to the quantitative or qualitative feature described. For example, a term of relative degree applied to orthogonality suggests an angle may have a magnitude of variability relative to a right angle. When values are presented herein for particular features and/or a magnitude of variability, ranges above, ranges below, and ranges between the values are contemplated.

What is claimed is:

1. A storage drive assembly, comprising:
   a storage drive sized and shaped for insertion into a slot within a chassis;
   a latching mechanism coupled to a first end of the storage drive, the latching mechanism including an actuation component actuable to transition the latching mechanism from a locked state in which the latching mechanism restricts displacement of the storage drive relative to the chassis to an unlocked state in which the latching mechanism enables displacement of the storage drive relative to the chassis; and
   a drive secure cover plate including a top portion and a tab each adapted to engage an opposite one of two outward-facing surfaces of the latching mechanism when the drive secure cover plate is coupled with the latching mechanism in the locked state in a position that prevents physical access to the actuation component, the drive secure cover plate being adapted to decouple and fully separate from the latching mechanism to permit transition of the latching mechanism from the locked state to the unlocked state.

2. The storage drive assembly of claim 1, wherein the drive secure cover plate couples with the latching mechanism by friction fit.

3. The storage drive assembly of claim 1, wherein the drive secure cover plate is adapted to be removed from the latching mechanism without disassembling the chassis.

4. The storage drive assembly of claim 1, wherein the latching mechanism further comprises:
   a latch adapted to be selectively released responsive to actuation of the actuation component, wherein releasing the latch causes the latch to rotate away from the storage drive assembly and displaces the storage drive relative to the chassis.

5. The storage drive assembly of claim 4, wherein the storage drive is physically fixed in the chassis and electrically coupled to a printed circuit board (PCB) of the chassis in the locked state, and displacement of the storage drive assembly disrupts the electrical coupling.

6. The storage drive assembly of claim 1, wherein the
   top portion is adapted to engage an upward facing surface of the latching mechanism when the drive secure cover plate is mated with the latching mechanism; and
   the tab is adapted to engage a downward facing surface of the latching mechanism when the drive secure cover plate is mated with the latching mechanism.

7. The storage drive assembly of claim 6, the tab comprising:
   a guiding edge adapted to guide the engagement between the tab and the downward facing surface.

8. The storage drive assembly of claim 7, wherein the top portion is adapted to apply downward pressure to the upward facing surface, the tab is adapted to apply upward pressure to the downward facing surface, and the applied upward pressure and the applied downward pressure at least partially opposing one another to fix the drive secure cover plate relative to the latching mechanism.

9. The storage drive assembly of claim 8, wherein the downward pressure opposes actuation of the actuation component.

10. The storage drive assembly of claim 6, wherein at least a portion of the actuation component is positioned between the top portion and the tab when the drive secure cover plate is mated with the latching mechanism.

11. The storage drive assembly of claim 6, the latching mechanism further comprising:
    a latch adapted to be selectively released in response to actuation of the actuation component, wherein the upward facing surface is a surface of the actuation component, and the downward facing surface is a surface of the latch.

12. A method, comprising:
    inserting a storage drive assembly into a slot in a chassis, the storage drive assembly including a storage drive and a latching mechanism, the latching mechanism including an actuation component actuable to transition the latching mechanism from a locked state to an unlocked state, the latching mechanism restricting displacement of the storage drive assembly relative to the chassis in the locked state and enabling displacement of the storage drive assembly relative to the chassis in the locked state;
    mating a drive secure cover plate with the latching mechanism, the mating including:
        applying downward pressure by a top portion of the drive sceure cover plate on an upward facing surface of the latching mechanism; and
        applying upward pressure by a tab of the drive secure cover plate to a downward facing surface of the latching mechanism, the upward pressure and the downward pressure at least partially opposing one another to fix the drive secure cover plate relative to the latching mechamism, the latching mechanism being prevented from transitioning from the locked state to the unlocked state when mated with the drive secure cover plate; and
    removing the drive secure cover plate from the latching mechanism to permit transition of the latching mechanism from the locked state to the unlocked state.

13. The method of claim 12, wherein the mating comprises:
    pressing the drive secure cover plate to friction fit around a portion of the latching mechanism, the portion including the actuation component.

14. The method of claim 12, further comprising:
    mating the drive secure cover plate with a second latching mechanism coupled to a first end of a second storage drive positioned within another slot of the chassis without disassembling the chassis.

15. The method of claim 12, further comprising:
    actuating the actuation component of the latching mechanism, the latching mechanism configured to release a latch of the latching mechanism and swing the latch away from the storage drive in response to the actuation, the swinging of the latch enabling displacement of the storage drive assembly relative to the chassis.

16. The method of claim 12, wherein the inserting includes electrically coupling the storage drive assembly to a printed circuit board (PCB) of the chassis, the electrical coupling disruptable by physically displacing the storage drive assembly in the unlocked state.

17. The method of claim 12, wherein the at least partially opposing upward pressure and downward pressure oppose an actuating motion of the actuation component of the latching mechanism, the actuating motion of the actuation component configured to transition the storage drive assembly from the locked state to the unlocked state when actuated.

18. The method of claim 12, wherein at least a portion of the actuation component of the latching mechanism configured to transition the storage drive assembly from the locked state to the unlocked state when actuated is positioned between the top portion and the tab of the mated drive secure cover plate.

19. The method of claim 12, wherein the latching mechanism includes a latch positioned below the actuation component of the latching mechanism, the actuation component configured to transition the storage drive assembly from the locked state to the unlocked state when actuated, the latch adapted to be selectively released in response to actuation of the actuation component, the upward facing surface being a surface of the actuation component, and the downward facing surface being a surface of the latch.

* * * * *